United States Patent
Tran

(10) Patent No.: US 12,143,247 B2
(45) Date of Patent: Nov. 12, 2024

(54) ADAPTIVE MODE IMBALANCE COMPENSATION

(71) Applicant: Aeonsemi, Inc., Grand Cayman (KY)

(72) Inventor: Ky-Anh Tran, Milpitas, CA (US)

(73) Assignee: Aeonsemi, Inc., Grand Cayman (KY)

( * ) Notice: Subject to any disclaimer, the term of this patent is extended or adjusted under 35 U.S.C. 154(b) by 154 days.

(21) Appl. No.: 17/865,898

(22) Filed: Jul. 15, 2022

(65) Prior Publication Data

US 2024/0022456 A1    Jan. 18, 2024

(51) Int. Cl.
| H04L 25/02 | (2006.01) |
| H03K 3/84 | (2006.01) |
| H04L 25/03 | (2006.01) |
| H04L 27/26 | (2006.01) |

(52) U.S. Cl.
CPC .... H04L 25/0272 (2013.01); H04L 25/03866 (2013.01); H04L 27/2613 (2013.01); H03K 3/84 (2013.01)

(58) Field of Classification Search
CPC ............ H04L 25/0272; H04L 25/0274; H04L 25/03866; H04L 27/2613; H03K 3/84
See application file for complete search history.

(56) References Cited

U.S. PATENT DOCUMENTS

| 6,940,973 B1 * | 9/2005 | Yeap ........................ H04M 3/18 375/285 |
| 8,928,425 B1 | 1/2015 | Sedarat et al. |
| 2013/0307712 A1 * | 11/2013 | Ali ...................... H03M 1/1057 341/120 |
| 2014/0368366 A1 * | 12/2014 | Galton .................. H03M 3/386 341/143 |

OTHER PUBLICATIONS

"Understanding Common-Mode Signals," Maxim Integrated, retrieved from https://www.analog.com/media/en/technical-documentation/tech-articles/understanding-commonmode-singals--maxim-integrated.pdf, dated Jun. 29, 2003, pp. 1-12.

* cited by examiner

Primary Examiner — David B Lugo
(74) Attorney, Agent, or Firm — Paradice & Li LLP

(57) ABSTRACT

Methods and apparatus for reducing mode conversion associated with differential signals are disclosed. An example method includes providing a common mode dither signal between a first terminal and a second terminal associated with a differential signal, generating a correlation signal representing a correlation of the common mode dither signal and the differential signal, and selectively incrementing a first capacitive loading at the first terminal or a second capacitive loading at the second terminal based at least in part on the correlation signal.

18 Claims, 4 Drawing Sheets

ADAPTIVE MODE IMBALANCE COMPENSATION

TECHNICAL FIELD

Aspects of the present disclosure relate generally to differential signaling, and more specifically to reducing mode imbalance in differential input or output signals.

BACKGROUND

Many modern circuits transmit and receive one or more analog signals for processing, filtering, amplification and the like. For example, such signals are often distributed in a differential format including two complementary signals where an electrical difference between the signals represents the analog signal. Mode imbalance refers to an inherent imbalance between the terminals used for input or output of the differential signals, which may be caused by design imperfections, or due to imperfections relating to one or more components, such as transformers, alternating current (AC) coupling, capacitors, and so on. Such mode imbalance may degrade desired signaling. For example, such mode imbalance may cause undesired common mode to differential mode conversion ("mode conversion"), as portions of the common mode signal are converted into a differential signal.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

Systems and methods for reducing mode conversion in differential signals are disclosed. One innovative aspect of the subject matter described in this disclosure can be implemented as a method for reducing mode conversion in a differential signal. In some implementations, the method may include providing a common mode dither signal between a first terminal and a second terminal associated with the differential signal, generating a correlation signal representing a correlation of the common mode dither signal and the differential signal, and selectively incrementing a first capacitive loading at the first terminal or a second capacitive loading at the second terminal based at least in part on the correlation signal.

Another innovative aspect of the subject matter described in this disclosure can be implemented as a mode conversion reduction circuit for a differential signal. In some implementations, the mode conversion reduction circuit may include a first terminal and a second terminal associated with the differential signal, a common mode dither signal generator to provide a common mode dither signal between the first terminal and the second terminal, a correlator to generate a correlation signal representing a correlation of the common mode dither signal and the differential signal, a first variable capacitance coupled to the first terminal, the first variable capacitance being based at least in part on the correlation signal, and a second variable capacitance coupled to the second terminal, the second variable capacitance being based at least in part on the correlation signal.

Another innovative aspect of the subject matter described in this disclosure can be implemented as a mode conversion reduction circuit for a differential signal. In some implementations, the mode conversion reduction circuit may include means for providing a common mode dither signal between a first terminal and a second terminal associated with the differential signal, means for generating a correlation signal representing a correlation of the common mode dither signal and the differential signal, and means for selectively incrementing a first capacitive loading at the first terminal or a second capacitive loading at the second terminal based at least in part on the correlation signal.

BRIEF DESCRIPTION OF THE DRAWINGS

The example implementations described herein are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Aspects of the present disclosure may be used to reduce mode imbalance associated with a differential signal by measuring the mode conversion resulting from a stimulus, and adjusting the capacitive loading associated with the differential signal based on such measuring. In some implementations, the mode imbalance may be reduced by tuning the capacitive loading at each input/output (I/O) terminal—at a positive terminal and at a negative terminal—associated with the differential signal. More particularly, the capacitive load may be tuned independently between the positive terminal and the negative terminal. Such tuning may be performed using a variable capacitor digital to analog converter (DAC) array, or any other suitable variable capacitance. The amount of mode conversion resulting from a known stimulus may be measured to tune these capacitive loads so as to compensate for the inherent mode imbalance in the circuit. In some aspects, such measurement may be performed by stimulating the differential terminals with a common mode current dither. Such a common mode current dither may be selected to be large enough to be correlated with signals received from the positive terminal and the negative terminal, but small enough not to significantly affect differential signals received via the positive terminal and the negative terminal. These and more details of the present disclosure are described in more detail below.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1:
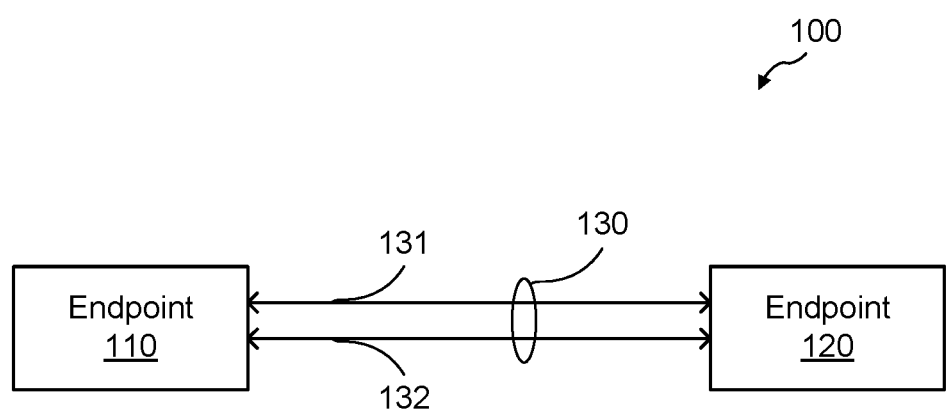
FIG. 1 shows a simplified circuit diagram of a differential signaling system.

FIG. 1 shows a simplified circuit diagram of a differential signaling system 100. The differential signaling system 100 may include an endpoint 110 and an endpoint 120, where the endpoint 110 and the endpoint 120 are coupled via a differential signal 130. The differential signal 130 is formed by a pair of complementary signals 131 and 132, where an electrical difference between the first signal 131 and the second signal 132 represents the magnitude of the differential signal. For example, the differential signal 130 may be transmitted from the endpoint 110 to the endpoint 120 or from the endpoint 120 to the endpoint 110. In other words, the signaling may be a full duplex communication. In some aspects, the endpoint 110 and the endpoint 120 may each be a microchip or other electrical circuit, and the differential signal 130 may be transmitted between the two endpoints over two or more wires, traces, or similar.

As discussed above, mode imbalance may be a significant problem relating to wireline differential signaling, and may result from design imperfections, or due to various components in or near a circuit, such as transformers, AC coupling, parasitic capacitance, and so on. For example, mode conversion may be caused by asymmetry in routing on a printed circuit board (PCB) or in wiring of a circuit, such as impedance variations, material inhomogeneities, ground plane gaps, and so on. Such mode conversion may degrade desired differential signaling, as common mode current is converted into differential signals.

Figure 2:
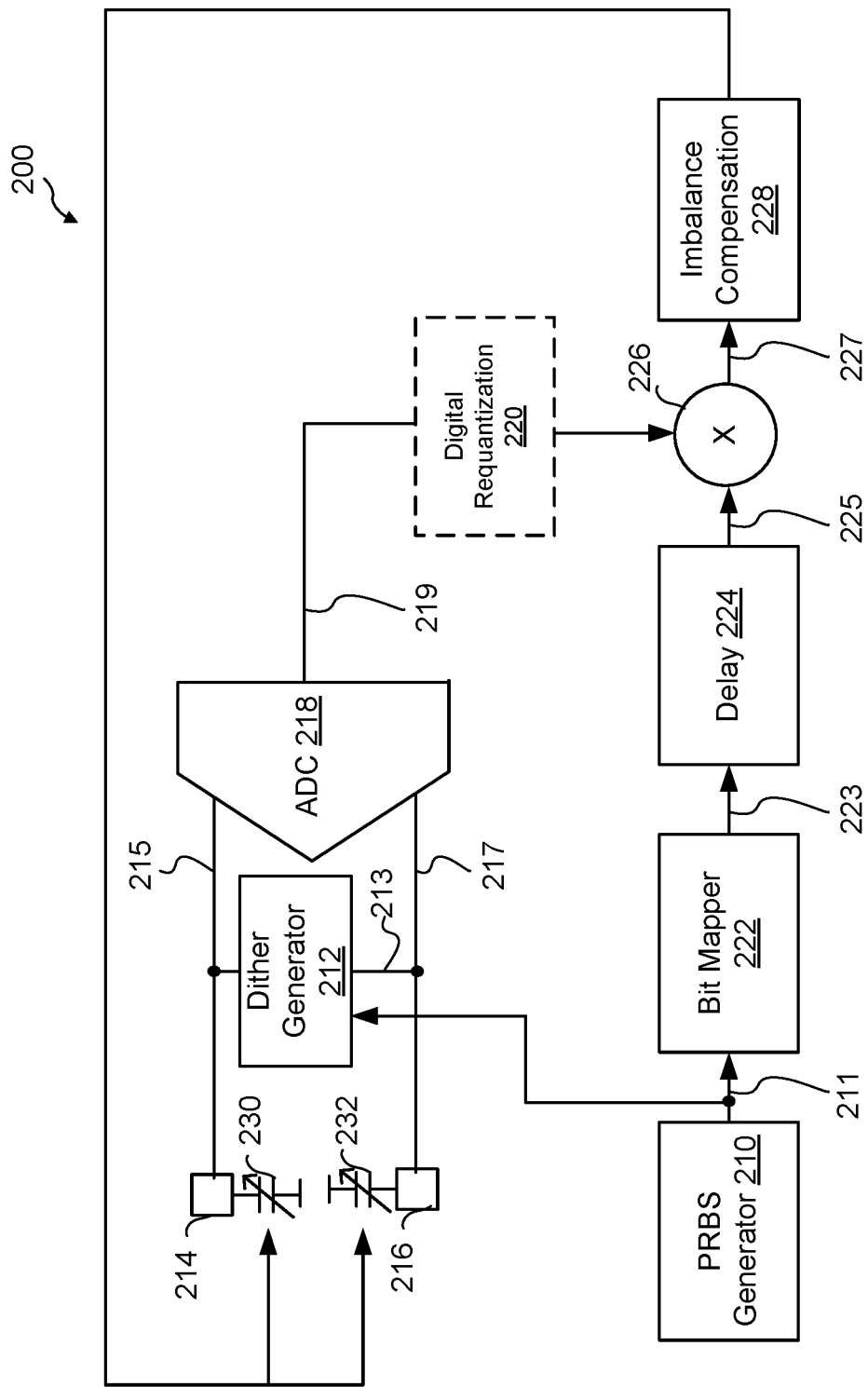
FIG. 2 shows a simplified circuit diagram of a mode conversion reduction circuit, in accordance with some implementations.

FIG. 2 shows a simplified circuit diagram of a mode conversion reduction circuit 200, in accordance with some implementations. The mode conversion reduction circuit 200 may measure mode conversion associated with a differential signaling interface and compensate for the measured mode conversion by adjusting the capacitive loading at each of the positive terminal and the negative terminal of the differential signaling interface. The mode conversion reduction circuit 200 is shown to include a pseudorandom binary sequence (PRBS) generator 210, a common mode dither signal generator 212, a first terminal 214, a second terminal 216, an analog to digital converter (ADC) 218, a bit mapper 222, a delay generator 224, a correlator 226, an average 228, a first variable capacitive loading 230, and a second variable capacitive loading 232.

The PRBS generator 210 generates a PRBS 211, including a series of ones and zeroes, which is provided to the common mode dither signal generator 212. The common mode dither signal generator 212 may generate a common mode current 213 between the first terminal 214 and the second terminal 216 based on the PRBS 211. For example, when the PRBS 211 has a value of zero, the common mode dither signal generator 212 may provide zero common mode current, while when the PRBS 211 has a value of one, the common mode dither signal generator may provide a predetermined common mode current between the first terminal 214 and the second terminal 216.

The ADC 218 may receive a first signal 215 from the first terminal 214 and a second signal 217 from the second terminal 216. The ADC 218 may further generate a digital signal 219 based on the first signal 215 and the second signal 217. For example, the ADC may generate the digital signal 219 based on an analog signal represented by an electrical difference between the first signal 215 and the second signal 217.

In some implementations, a digital requantizer 220 may receive and requantize the digital signal 219, for example, to reduce quantization noise or spurious tones in the digital signal 219. For example, the digital requantizer 220 may reduce a resolution of the digital signal 219, which may improve power consumption and circuit area, while also reducing or removing quantization bias from the digital signal 219.

The PRBS 211 may also be provided from the PRBS generator 210 to the bit mapper 222. The bit mapper 222 may map zeroes of the PRBS 211 to values of negative one (−1) and may map ones of the PRBS 211 to values of positive one (+1). In some other aspects, the bit mapper 222 may map the bits of the PRBS 211 to various other values. Still further, in some aspects, the bit mapping may be omitted.

The bit mapped signal 223 may be provided from the bit mapper 222 to the delay generator 224. The delay generator 224 may generate a delayed signal 225 by delaying the bit mapped signal 223 based on the pulse response associated with the PRBS 211. For example, to probe the effect of the mode imbalance in the time domain at a particular delay, this delay may be adjusted based on the pulse response associated with the PRBS 211 used to provide the stimulus to the first terminal 214 and the second terminal 216. In some implementations, the delay may be heuristically adjusted based on the pulse response. In some aspects, the delay may be selected based on a location of a main cursor delay of the pulse response. For example, in a simple implementation the main cursor delay of the pulse response may be selected as the delay implemented by the delay generator 224.

The delayed signal 225 and the digital signal 219 may be provided to the correlator 226, which may correlate the delayed signal with the digital signal. The amount of mode imbalance associated with the first terminal 214 and the second terminal 216 may be estimated based on a signal representing this correlation (a "correlation signal").

The mode imbalance compensation circuit 228 averages the correlation signal, in order to estimate the average mode imbalance, and thereby determine how the mode conversion reduction circuit 200 should compensate for this mode imbalance. The mode imbalance compensation circuit 228 may include any suitable circuitry for determining the average of the correlation signal in order to determine how to compensate for the mode imbalance. For example, the mode imbalance compensation circuit 228 may include an integrator for determining the average. In some implementations the correlator 226 and the mode imbalance compensation circuit 228 may be combined into a single circuit which determines the average correlation of the delayed signal 225 and the digital signal 219. The averaging may reduce the influence on the mode imbalance compensation of noise or signal components uncorrelated with the common mode current dither signal. In some aspects, a sign of the averaged correlation signal (such as positive or negative) may indicate a direction of compensation for the estimated mode imbalance. For example, a positive averaged correlation signal may indicate a first direction of compensation a negative averaged correlation signal may indicate a second direction of compensation.

Variable capacitances 230 and 232 may adjust the capacitive loading at the first and second terminals 214 and 216, respectively, based on the averaged correlation signal to compensate for the estimated mode imbalance. In some aspects, respective capacitances of the first variable capacitance 230 and the second variable capacitance 232 may be digitally controlled, such as via a tunable digital to analog converter (DAC) array of capacitors. (not shown for simplicity). In some aspects, adjusting the first capacitive loading and the second capacitive loading may include adjusting the first variable capacitance 230 and the second variable capacitance 232 by a predetermined increment based on the sign of the averaged correlation signal. For example, the first variable capacitance 230 may be increased and the second variable capacitance 232 may be decreased in response to a positive averaged correlation signal (where the first terminal 214 is the positive terminal and the second terminal 216 is the negative terminal). On the other hand, the first variable capacitance 230 may be decreased and the second variable capacitance 232 may be increased in response to a negative averaged correlation signal (where the first terminal 214 is the negative terminal and the second terminal 216 is the positive terminal).

Figure 3:
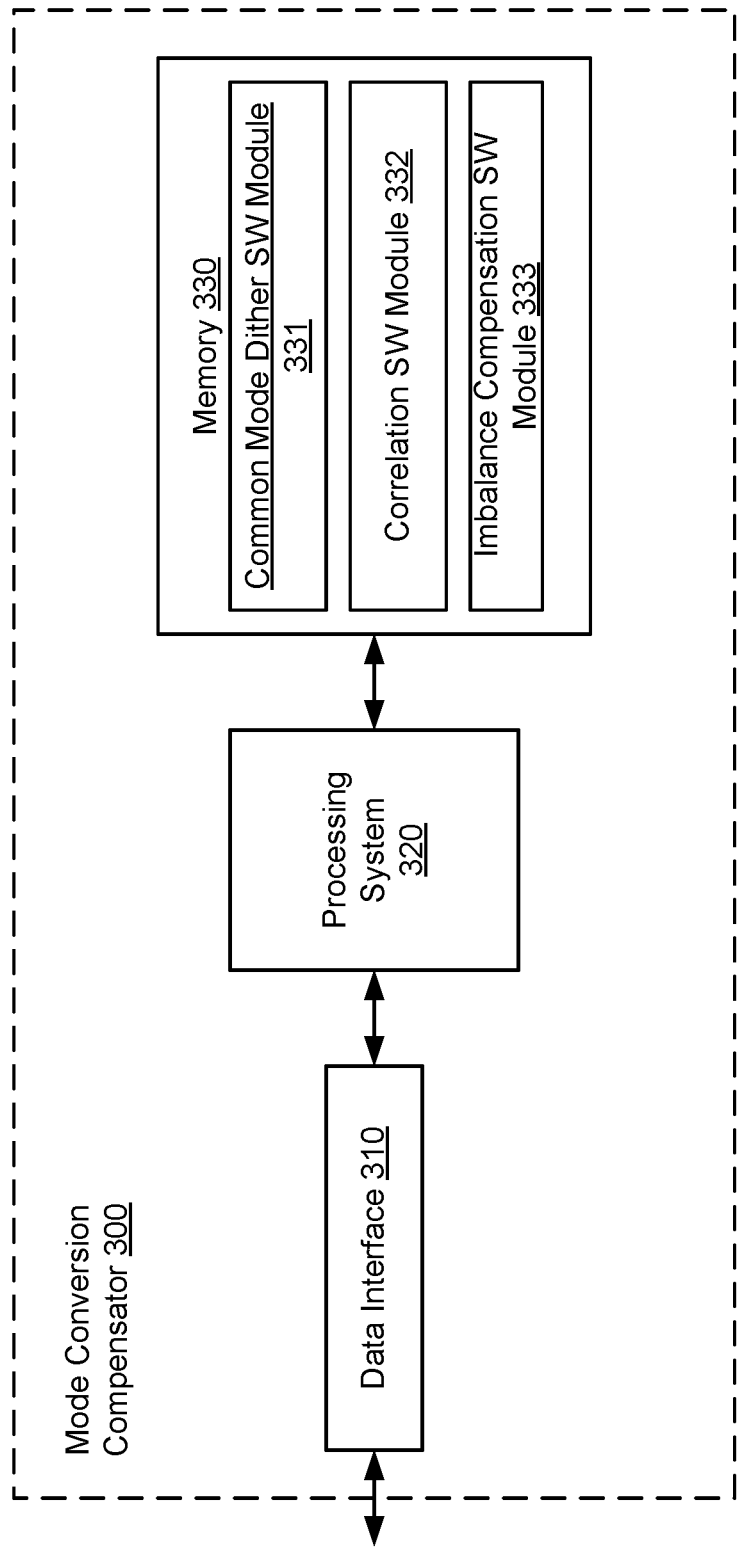
FIG. 3 shows a block diagram of mode conversion compensator, according to some implementations

FIG. 3 shows a block diagram of mode conversion compensator 300, according to some implementations. In some implementations, the mode conversion compensator 300 may be one example of the mode conversion reduction circuit 200 of FIG. 2.

In some implementations, the mode conversion compensator 300 may include a data interface 310, a processing system 320, and a memory 330. The data interface 310 is configured to transmit and receive differential signals, such as via a pair of terminals such as the first terminal 214 and the second terminal 216.

The memory 330 may include a non-transitory computer-readable medium (including one or more nonvolatile memory elements, such as EPROM, EEPROM, Flash memory, a hard drive, and the like) that may store at least the following software (SW) modules:

- A common mode dither SW module 331 to generate a common mode dither signal between a first terminal and a second terminal associated with the differential signal;
- a correlation SW module 332 to generate a correlation signal representing a correlation of the common mode dither signal and the differential signal; and
- an imbalance compensation SW module 333 to selectively increment a first capacitive loading at the first terminal or a second capacitive loading at the second terminal based at least in part on the correlation signal.

Each software module includes instructions that, when executed by the processing system 320, causes the mode conversion compensator 300 to perform the corresponding functions.

The processing system 320 may include any suitable one or more processors capable of executing scripts or instructions of one or more software programs stored in the mode conversion compensator 300 (such as in memory 330). For example, the processing system 320 may execute the common mode dither SW module 331 to generate a common mode dither signal between a first terminal and a second terminal associated with the differential signal. The processing system 320 also may execute the correlation SW module 332 to generate a correlation signal representing a correlation of the common mode dither signal and the differential signal. Further, the processing system 320 may execute the imbalance compensation SW module 333 to selectively increment a first capacitive loading at the first terminal or a second capacitive loading at the second terminal based at least in part on the correlation signal.

Figure 4:
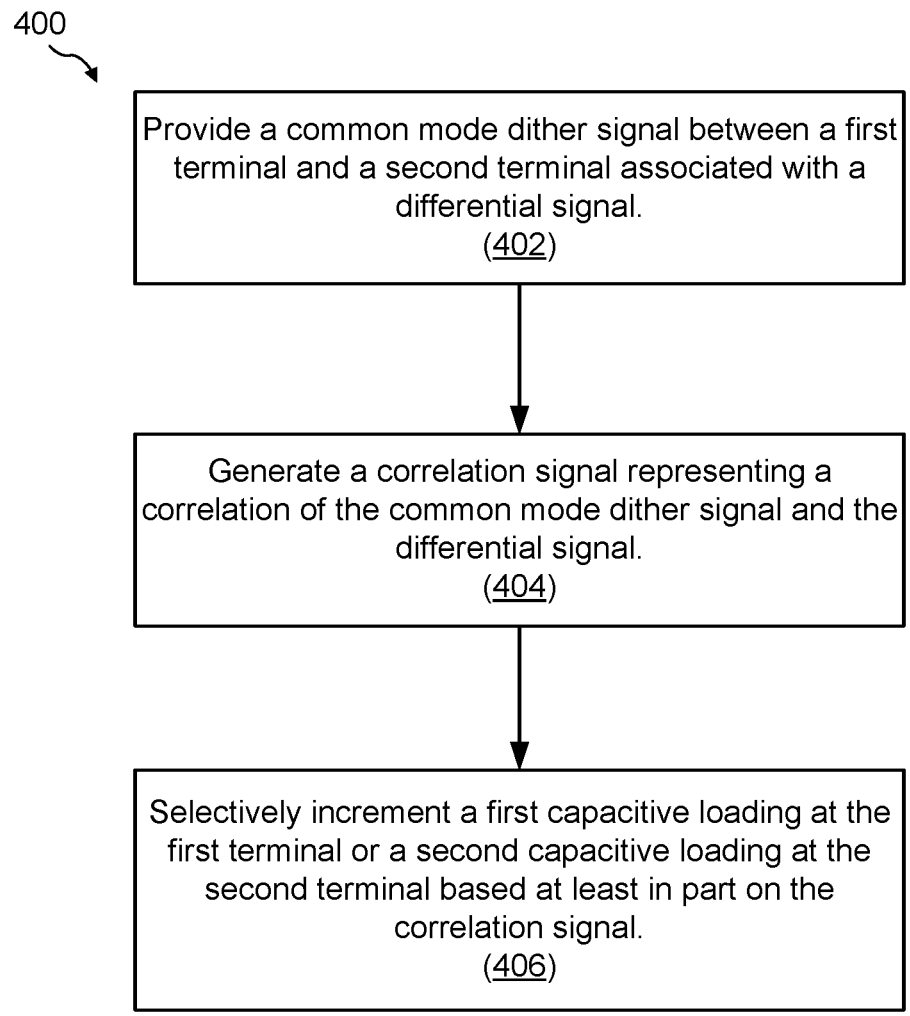
FIG. 4 shows an illustrative flowchart depicting an example operation for reducing mode conversion in a differential signal, according to some implementations.

FIG. 4 shows an illustrative flowchart depicting an example operation 400 for reducing mode conversion in a differential signal, according to some implementations. The operation 400 may be used to operate the mode conversion reduction circuit 200 of FIG. 2 or any other feasible circuit configured to measure and compensate for measured mode imbalance in differential signals.

The operation 400 may begin with providing a common mode dither signal between a first terminal and a second terminal associated with a differential signal (402). In some implementations, a means for providing the common mode dither signal may include the PRBS generator 210 and the common mode dither signal generator 212 of FIG. 2 or processing system 320 executing the common mode dither SW module 331 of FIG. 3.

The operation 400 may proceed with generating a correlation signal representing a correlation of the common mode dither signal and the differential signal (404). In some implementations, a means for generating the correlation signal may include the ADC 218, the digital requantizer 220, the correlator 226, the bit mapper 222, the delay generator 224, and the average 228 of FIG. 2, or the processing system 320 executing the correlation SW module 332 of FIG. 3.

The operation 400 may proceed with selectively incrementing a first capacitive loading at the first terminal or a second capacitive loading at the second terminal based at least in part on the correlation signal (406). In some implementation, a means for selectively incrementing the first capacitive loading or the second capacitive loading may include the first variable capacitance 230 and the second variable capacitance 232 of FIG. 2, or the processing system 320 executing the imbalance compensation SW module 333 of FIG. 3.

In some aspects, selectively incrementing the first capacitive loading or the second capacitive loading in block 406 further includes generating an average of the correlation signal and incrementing the first capacitive loading or the second capacitive loading based on a sign of the average of the correlation signal. In some aspects, selectively incrementing the first capacitive loading or the second capacitive loading in block 406 further includes increasing the first capacitive loading and decreasing the second capacitive loading in response to the average of the correlation signal being positive, and decreasing the first capacitive loading and increasing the second capacitive loading in response to the average of the correlation signal being negative. In some aspects, selectively incrementing the first capacitive loading or the second capacitive loading in block 406 further includes increasing or decreasing one or more of a first variable capacitance coupled to the first terminal or a second variable capacitance coupled to the second terminal. In some aspects, increasing or decreasing the first variable capacitance includes increasing or decreasing the first variable capacitance by a predetermined increment, and increasing or decreasing the second variable capacitance includes increasing or decreasing the second variable capacitance by the predetermined increment.

In some aspects, the operation 400 further includes generating the common mode dither signal based at least in part on a pseudorandom binary sequence (PRBS). In some aspects, the common mode dither signal provides zero common mode current in response to the PSBR having a value of zero, and the common mode dither signal provides a predetermined common mode current in response to the PRBS having a value of one.

In some aspects, generating the correlation signal in block 404 further includes generating a delayed signal based at least in part on the PRBS and a pulse response associated with the PRBS, and generating the correlation signal based at least in part on the delayed signal and on the differential signal. In some aspects, generating the correlation signal in block 404 further includes generating a mapped PRBS by mapping zeroes of the PRBS to minus one, and mapping ones of the PRBS to positive one, and generating the delayed signal by delaying the mapped PRBS based at least in part on the pulse response.

In some aspects, generating the correlation signal in block 404 further includes generating a digital signal by digitizing the signal received from the first terminal and the second terminal using an analog to digital converter (ADC) and generating the correlation signal based at least in part on the digital signal.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method for reducing mode conversion in a differential signal, the method comprising:
   providing a common mode dither signal between a first terminal and a second terminal associated with the differential signal;
   generating a correlation signal representing a correlation of the common mode dither signal and the differential signal; and
   selectively incrementing a first capacitive loading at the first terminal or a second capacitive loading at the second terminal based at least in part on the correlation signal, wherein selectively incrementing the first capacitive loading or the second capacitive loading comprises generating an average of the correlation signal and incrementing the first capacitive loading or the second capacitive loading based on a sign of the average of the correlation signal.

2. The method of claim 1, wherein selectively incrementing the first capacitive loading or the second capacitive loading further comprises increasing the first capacitive loading and decreasing the second capacitive loading in response to the average of the correlation signal being positive, and decreasing the first capacitive loading and increasing the second capacitive loading in response to the average of the correlation signal being negative.

3. The method of claim 1, wherein selectively incrementing the first capacitive loading or the second capacitive loading further comprises increasing or decreasing one or more of a first variable capacitance coupled to the first terminal or a second variable capacitance coupled to the second terminal.

4. The method of claim 3, wherein increasing or decreasing the first variable capacitance comprises increasing or decreasing the first variable capacitance by a predetermined increment, and increasing or decreasing the second variable capacitance comprises increasing or decreasing the second variable capacitance by the predetermined increment.

5. The method of claim 1, further comprising generating the common mode dither signal based at least in part on a pseudorandom binary sequence (PRBS).

6. The method of claim 5, wherein the common mode dither signal provides zero common mode current in response to the PRBS having a value of zero, and the common mode dither signal provides a predetermined common mode current in response to the PRBS having a value of one.

7. The method of claim 5, wherein generating the correlation signal further comprises:
   generating a delayed signal based at least in part on the PRBS and a pulse response associated with the PRBS; and
   generating the correlation signal based at least in part on the delayed signal and the differential signal.

8. The method of claim 7, wherein generating the correlation signal further comprises generating a mapped PRBS by mapping zeroes of the PRBS to minus one and mapping ones of the PRBS to positive one and generating the delayed signal by delaying the mapped PRBS based at least in part on the pulse response.

9. The method of claim 1, wherein generating the correlation signal further comprises generating a digital signal by digitizing the signal received from the first terminal and the second terminal using an analog to digital converter (ADC) and generating the correlation signal based at least in part on the digital signal.

10. A mode conversion reduction circuit for a differential signal, comprising:
a first terminal and a second terminal associated with the differential signal;
a common mode dither signal generator to provide a common mode dither signal between the first terminal and the second terminal;
a correlator to generate a correlation signal representing a correlation of the common mode dither signal and the differential signal;
a first variable capacitance coupled to the first terminal, the first variable capacitance being based at least in part on the correlation signal; and
a second variable capacitance coupled to the second terminal, the second variable capacitance being based at least in part on the correlation signal;
wherein the first variable capacitance and the second variable capacitance are each based on a sign of an average value of the correlation signal.

11. The mode conversion reduction circuit of claim 10, wherein the first variable capacitance is increased and the second variable capacitance is decreased in response to the average of the correlation signal being positive, and the first variable capacitance is decreased and the second variable capacitance is increased in response to the average of the correlation signal being negative.

12. The mode conversion reduction circuit of claim 11, wherein increasing or decreasing the first variable capacitance comprises increasing or decreasing the first variable capacitance by a predetermined increment, and increasing or decreasing the second variable capacitance comprises increasing or decreasing the second variable capacitance by the predetermined increment.

13. The mode conversion reduction circuit of claim 10, further comprising a pseudorandom binary sequence (PRBS) generator configured to generate a PRBS, wherein the common mode dither signal is generated based at least in part on the PRBS.

14. The mode conversion reduction circuit of claim 13, wherein the common mode dither signal provides zero common mode current in response to the PRBS having a value of zero, and the common mode dither signal provides a predetermined common mode current in response to the PRBS having a value of one.

15. The mode conversion reduction circuit of claim 13, wherein the correlator comprises:
an adjustable delay circuit to generate a delayed signal based at least in part on the PRBS and on a pulse response associated with the PRBS;
wherein the correlator generates the correlation signal based at least in part on the delayed signal and on the differential signal.

16. The mode conversion reduction circuit of claim 15, wherein the correlator comprises a bit mapper to generate a mapped PRBS by mapping zeroes of the PRBS to minus one and mapping ones of the PRBS to positive one, wherein the delayed signal is generated by delaying the mapped PRBS based at least in part on the pulse response.

17. The mode conversion reduction circuit of claim 10, wherein the correlator comprises an analog to digital converter (ADC) configured to generate a digital signal by digitizing the signal received from the first terminal and the second terminal, wherein the correlation signal is based at least in part on the digital signal.

18. A mode conversion reduction circuit, comprising:
means for providing a common mode dither signal between a first terminal and a second terminal associated with a differential signal;
means for generating a correlation signal representing a correlation of the common mode dither signal and the differential signal; and
means for selectively incrementing a first capacitive loading at the first terminal or a second capacitive loading at the second terminal based at least in part on the correlation signal, wherein the means for selectively incrementing the first capacitive loading or the second capacitive loading comprises means for generating an average of the correlation signal and incrementing the first capacitive loading or the second capacitive loading based on a sign of the average of the correlation signal.

* * * * *